United States Patent [19]
Pierrat

[11] Patent Number: 6,106,979
[45] Date of Patent: Aug. 22, 2000

[54] USE OF ATTENUATING PHASE-SHIFTING MASK FOR IMPROVED PRINTABILITY OF CLEAR-FIELD PATTERNS

[75] Inventor: Christophe Pierrat, Boise, Id.

[73] Assignee: Micron Technology, Inc., Boise, Id.

[21] Appl. No.: 09/000,595

[22] Filed: Dec. 30, 1997

[51] Int. Cl.[7] .................................................. G03F 9/00
[52] U.S. Cl. ............................................................ 430/5
[58] Field of Search ............................... 430/5, 322, 324, 430/311

[56] References Cited

U.S. PATENT DOCUMENTS

| | | | |
|---|---|---|---|
| H1525 | 4/1996 | Geil et al. | 355/44 |
| 4,608,268 | 8/1986 | Shimkunas | 427/8 |
| 4,653,860 | 3/1987 | Hendrix | 350/336 |
| 4,686,162 | 8/1987 | Stangl et al. | 430/5 |
| 5,045,419 | 9/1991 | Okumura | 430/20 |
| 5,047,117 | 9/1991 | Roberts | 156/643 |
| 5,194,345 | 3/1993 | Rolfson . | |
| 5,194,346 | 3/1993 | Rolfson et al. | 430/5 |
| 5,208,125 | 5/1993 | Lowrey et al. . | |
| 5,217,830 | 6/1993 | Lowrey | 430/5 |
| 5,225,035 | 7/1993 | Rolfson | 156/643 |
| 5,229,872 | 7/1993 | Mumola | 359/40 |
| 5,240,796 | 8/1993 | Lee et al. . | |
| 5,254,218 | 10/1993 | Roberts et al. . | |
| 5,281,500 | 1/1994 | Cathey et al. | 430/5 |
| 5,288,568 | 2/1994 | Cathey, Jr. | 430/5 |
| 5,288,569 | 2/1994 | Lin | 430/5 |
| 5,372,901 | 12/1994 | Rolfson et al. . | |
| 5,468,578 | 11/1995 | Rolfson | 430/5 |
| 5,487,963 | 1/1996 | Sugawara | 430/5 |
| 5,495,959 | 3/1996 | Rolfson . | |
| 5,503,951 | 4/1996 | Flanders et al. | 430/5 |
| 5,527,645 | 6/1996 | Pati et al. | 430/5 |
| 5,536,606 | 7/1996 | Doan | 430/5 |
| 5,546,225 | 8/1996 | Shiraishi | 359/559 |
| 5,565,286 | 10/1996 | Lin | 430/5 |
| 5,567,573 | 10/1996 | Morton | 430/320 |
| 5,576,126 | 11/1996 | Rolfson . | |
| 5,582,939 | 12/1996 | Pierrat | 430/5 |
| 5,667,918 | 9/1997 | Brainerd et al. . | |
| 5,672,450 | 9/1997 | Rolfson . | |
| 5,686,208 | 11/1997 | Le et al. | 430/5 |
| 5,691,541 | 11/1997 | Ceglio et al. | 250/492 |
| 5,695,896 | 12/1997 | Pierrat . | |
| 5,698,347 | 12/1997 | Bae | 430/5 |
| 5,718,829 | 2/1998 | Pierrat | 430/5 |
| 5,759,724 | 6/1998 | Rolfson . | |
| 5,766,829 | 6/1998 | Cathey et al. . | |
| 5,786,116 | 7/1998 | Rolfson . | |
| 5,827,625 | 10/1998 | Lucas et al. | 430/10 |

OTHER PUBLICATIONS

Yan, P., et al., "Sub–micron low–k//1 imaging characteristics using a DUV printing tool and binary masks", Proceedings of SPIE, vol. 2440, Society of Photo–Optical Instrumentation Engineers, Bellingham, WA, 270–77, (1995).

Barouch, E., et al., "Vector aerial image with off–axis illumination", Proceedings of SPIE, vol. 1927, Pt. 2, Optical/Laser Microlithography Conference, San Jose, CA, 686–708, (1993).

(List continued on next page.)

*Primary Examiner*—S. Rosasco
*Attorney, Agent, or Firm*—Schwegman, Lundberg, Woessner & Kluth P.A.

[57] ABSTRACT

An improved photolithographic method employs a pattern of subresolution openings to enhance the printability of clear-field patterns. Incorporating a subresolution opening along the edges of the transmission areas prevents the printing of side lobe light and enables incorporation of a positive bias in the clear-field pattern. This in turn increases the lithographic process latitudes. The photomask must be significantly overexposed as a result of using a positive bias. To compensate for the impact of increased exposure on large transmission areas and avoid degradation of the corresponding resist, a pattern of subresolution openings is incorporated in the large transmission areas. The size and orientation of the subresolution areas creates a diffraction grating effect, reducing the exposure of the area under each transmission area.

16 Claims, 4 Drawing Sheets

OTHER PUBLICATIONS

Bor, Z., et al., "New phase–shifting technique for deep UV excimer laser–based lithography", Proceedings of SPIE, vol. 2380, Society of Photo–Optical Instrumentation Engineers, Bellingham, WA, 195–202, (1995).

Brunner, T.A., "Rim phase shift mask combined with off–axis illumination: a path to 0.5 lambda/numerical aperture geometries", *Optical Engineering,* vol. 32, No. 10, 2337–43, (Oct. 1993).

Erdelyi, M., et al., "Enhanced microlithography using combined phase shifting and off–axis illumination", *Japanese Journal of Applied Physics,* Part 2: vol. 34, No. 12A, L1629–L1631, (Dec. 1, 1995).

Erdelyi, M., et al., "New interferometric phase–shifting technique for sub–half–micron laser microlithography", Proceedings of SPIE, vol. 2440, Society of Photo–Optical Instrumentation Engineers, Bellingham, WA, 827–37, (1995).

Ham, Y., et al., "Fundamental analysis on fabrication of 256 MB DRAM using the phase shift technology", Proceedings of SPIE, vol. 2197, Optical/Laser Microlithography VII Conference, San Jose, CA, 243–52, (1994).

Kim, K., et al., "Implementation of i–line lithography to 0.30 um design rules", Proceedings of SPIE, vol. 2440, Society of Photo–Optical Instrumentation Engineers, Bellingham, WA, 76–87, (1995).

Levenson, M.D., "Extending optical lithography to the gigabit era", *Microlithography World,* vol. 3, No. 4, (Autumn 1994).

Loong, W., et al., "Simulation study of a new phase–shifting mask: halftone–rim", Proceedings of SPIE, vol. 2440, Society of Photo–Optical Instrumentation Engineers, Bellingham, WA, 448–57, (1995).

Ogawa, T., et al., "Subquarter micron optical lithography with practical superresolution technique", Proceedings of SPIE, vol. 2440, Society of Photo–Optical Instrumentation Engineers, Bellingham, WA, 772–83, (1995).

Thakar, G.V., et al., "High performance 0.3 mu m CMOS I–line lithography and BARC", *Digest of Technical Papers,* 1995 IEEE Symposium on VLSI Technology, Piscataway, NJ, 75–76, (1995).

Lin, B.J., "The Attenuated Phase–Shifting Mask", *Solid State Technology,* 35, 43–47, (Jan. 1992).

Ahn, C., et al., "Study of optical proximity effects using off–axis illumination with attenuated phase shift mask", Proceedings of SPIE, vol. 2440, Society of Photo–Optical Instrumentation Engineers, Bellingham, WA, 222–39, (1995).

USE OF ATTENUATING PHASE-SHIFTING MASK FOR IMPROVED PRINTABILITY OF CLEAR-FIELD PATTERNS

This invention was made with government support under Contract No. MDA972-92-C-0054, awarded by Advanced Research Projects Agency (ARPA). The Government has certain rights in this invention.

FIELD OF THE INVENTION

The present invention relates in general to methods and apparatus for photolithography, and particularly to printing clear field patterns using attenuated phase-shifting masks.

BACKGROUND OF THE INVENTION

The art of photolithography embodies techniques for creating patterns on a work surface by the controlled application of energy (such as electromagnetic, ion beam or other radiation) to a reactive material deposited on a wafer. The energy application is controlled through the use of a photomask. Photomask features are essentially a pattern of optically clear and optically opaque areas or fields formed on a glass plate. The optically opaque areas of the pattern block the light, thereby casting shadows and creating dark areas, while the optically clear areas allow the light to pass, thereby creating light areas. Dark-field (or negative polarity) masks expose the contacts, while clear-field (or positive polarity) masks expose the lines. Optical effects, such as diffraction and convergence, directly affect device quality and must be addressed when manufacturing photomasks. One common problem is the edges between the transmissive and opaque areas cause diffraction, creating constructive interference, which in turn limits feature resolution. Constructive interference is caused by energy waves which are bent and re-radiated, resulting in exposure reduction in transparent areas and undesirable illumination in opaque or dark areas.

Diffraction is a significant limiting factor for optical photolithography. As manufacturing requirements call for increased feature densities and devices with smaller dimensions, the need for well-defined features and good image contrast increases as well. Increased pattern density on the mask decreases distance between any two opaque areas, as well as the overall size of each of the areas. As area feature size decreases, the impact of diffraction, as well as other optical effects, increases proportionately. In addition, conventional methods of controlling diffraction mandate a minimum distance between features, thereby decreasing process latitudes. One approach toward enhancing the performance of photo lithographic processing has been to employ phase-shifting technology as part of the masking material.

Phase-shift lithography shifts the phase of one area of incident energy waves approximately 180° relative to an adjacent area of incident light waves to create a more sharply defined interface between the adjacent areas than is otherwise possible. The energy that would be diffracted is converted from constructive interference (proximity effect) to destructive interfering wave energy. A primary result of phase-shifting masks is improved image resolution and contrast. In general, a phase-shifting photomask is constructed with a repetitive pattern formed of three distinct layers. An opaque layer provides areas that allow no light transmission, a transparent layer provides areas which allow close to 100% of light to pass through and a phase-shifting layer provides areas which allow close to 100% of light to pass through but phase-shifted 180 degrees from the light passing through the transparent areas. The transparent areas and phase-shifting areas are situated such that light rays diffracted through each of the areas is canceled out, producing a darkened area. This creates the pattern of dark and bright areas which can be used to clearly delineate features of a pattern defined by the opaque layer of the mask on a photo-patterned semiconductor wafer. Phase-shifting masks have been shown to improve the resolution of photolithography between 25–100%.

There are several variations of phase-shifting masks, such as alternate aperture, rim and attenuated. Alternate aperture phase-shifting masks are formed by depositing a phase-shift material over the opaque layer and into every other opening in the opaque layer. This is termed an "additive" phase-shifting mask. Alternately, phase-shift areas of the mask may be formed in areas of the plate having a decreased thickness. This is termed a "subtractive" phase-shifting mask. This type of phase-shifting mask is patterned to ensure that light from transparent areas near enough to each other for the energy waves to interfere have opposite phases. The resulting image has a dark line, produced by destructive interference, between images of every transparent area. The images have as a result higher contrast, which translates to better feature resolution. Alternate aperture phase-shifting creates strong proximity effects, however, making it difficult to delineate all feature sizes and shapes for an arbitrary mask pattern using one common exposure.

In a rim phase-shifting mask, a layer of a transparent phase-shift material is deposited over the opaque areas and into the edge of the transparent areas. This produces rim phase-shifters on the sidewalls of the opaque areas on either side of each transparent opening. When using a rim phase-shifting mask, the light passing through a rim phase-shifter is phase-shifted relative to the light passing through the transparent area. As a result the phase-shifted light forms a null on the work surface that corresponds to the edges of the opaque areas. This creates destructive interference, negating the effect of diffraction along the edges of the opaque areas, producing sharpened images. Rim phase-shifting mask technology is limited in application, however, because custom fabrication processes are generally required to form the opaque layer to a minimum required thickness. Thus it tends to be an expensive and time consuming process. Standard mask blanks employed in semiconductor manufacture are difficult to use with this method because the opaque layer on these masks is not formed to the required thickness. In addition, a rim phase-shifting mask requires more mask area than other techniques because it requires large bias to reduce exposure times to a reasonable level.

Both alternating aperture and rim phase-shifting techniques increase the complexity of mask fabrication, in part as a result of being three-layer structures. Attenuated phase-shifting masks have the advantage of being a two layer structure, simplifying the manufacturing process. Attenuated phase-shifting masks, described in Burn J. Lin, "The Attenuated Phase-Shift Mask", 43–47 *Solid State Technology* (January 1992), use a slightly transmissive absorber with a 180° phase-shift in the place of the opaque material in the mask pattern. Unlike many other phase-shifting masks, attenuated phase-shifting masks can be used for any arbitrary mask pattern. An attenuated phase-shifting mask shifts the phase of dark areas but with an attenuated amplitude to prevent producing too much light in those areas. The negative amplitude provides the desired improvement in image edge contrast and the attenuation prevents the negative amplitude from becoming a problem. Resolution of closely packed features is further improved by using an attenuated phase-shifting mask with a mask bias because exposure times and diffractive effects can be reduced. Conventional attenuated phase-shifting dark-field masks use a positive mask bias, and clear-field masks use a negative bias. In both mask types openings are larger and opaque features are smaller on the mask than the size printed on the wafer. As an example, Lin, in U.S. Pat. No. 5,288,569 ("Feature Biasing and Absorptive Phase-Shifting Techniques to Improve Optical Projection Imaging") describes a system for improving pattern processing by using, in conjunction with absorptive phase-shifting masks, a negative bias for isolated or less dense arrangements of features. The bias helps control the effect of side lobe light resulting from diffraction at the feature edges, but the bias also takes a toll on process latitudes.

Alternate aperture and rim phase shifting masks have the disadvantage of requiring a significant mask area between mask patterns. This makes it difficult to reduce the distance between adjacent patterns on the work surface and thus limits feature density. While attenuated phase shifting masks provide the ability to reduce the inter-pattern space, interference of side-lobe light from masked areas with the main lobe light of the pattern areas results from the difference in phase between the respective areas. This reduces the effect of the phase shift and detrimentally effects the intended pattern. What is needed is a way to achieve the positive effects of attenuated phase shifting while avoiding or preventing side lobe interference without severely impacting process latitudes. One partial solution is described in U.S. Pat. No. 5,487,963, entitled "Phase Shifting Mask Wherein Light Transmitted Through Second Transmission Areas Intensifies Light Through First Transmission Areas", and granted to Sugawara, wherein side lobe light is dealt with by turning it to an advantage. Sugawara discloses a method for forming dense patterns such that side lobe light from one opening enhances the main lobe light of an adjacent opening. The combination of bright areas of enhanced main lobe light and dark areas between openings created by destructive interference through use of phase shifting material between openings enables the manufacture of a better-defined pattern. The method described by Sugawara is limited, however, because side lobe light from the phase-shifted areas destructively interferes with the adjoining bright areas, reducing the effect of the combined energy of adjacent patterns as feature size decreases. There remains a need for a means of reducing or eliminating the effect of side lobe interference without reducing process latitudes.

Another area of concern with conventional methods for processing photomasks using attenuating material in conjunction with phase-shifting techniques is the degradation of resist. As exposure times increase, resist thickness is degraded in large transmission areas as a result of the extended exposure. What is needed is a means for equalizing the exposure of transmission areas in an attenuated phase-shifting photomask.

SUMMARY OF THE INVENTION

The present invention describes a method of using attenuated phase-shifting masks to print isolated or dense clear field patterns. Higher process latitudes are achieved through incorporation of a slight positive bias in the opaque areas of the mask pattern. Photomask processing employing the method of the present invention is simpler than processing techniques such as alternating aperture phase-shifting masks. Where side lobe light is likely to occur a subresolution opening is introduced into the pattern to cancel the light from the side lobe. To avoid resist thickness loss in large transmission areas, a pattern of subresolution openings is incorporated to reduce the amount of light transmitted.

The present invention proposes a method and apparatus for printing clear-field patterns, where process latitudes are expanded and side lobe light interference is neutralized. According to one embodiment of the present invention, a photomask is fabricated by depositing an attenuating phase-shifting material on a transparent plate according to a pattern comprising one or more transparent areas intermingled with one or more opaque transmission areas. A plurality of the one or more opaque transmission areas comprise a pattern of subresolution openings. In one embodiment the pattern of subresolution openings comprises subresolution openings parallel to each edge of the one or more opaque transmission areas. In another embodiment subresolution openings in a plurality of the one or more opaque transmission areas are arranged in a grid-like pattern.

In yet another embodiment the photomask comprises a clear-field pattern. According to a further embodiment the photomask incorporates a positive bias, thereby expanding process latitudes.

According to yet another embodiment, a method for manufacturing a photomask is described, comprising the steps of preparing a transparent plate and forming a mask pattern on the transparent plate by depositing attenuating phase-shifting material. The material is deposited in a pattern of one or more opaque transmission areas intermingled with one or more transparent areas. In one embodiment the material creating the one or more opaque transmission areas is deposited so as to form a pattern of subresolution openings. In a further embodiment the subresolution openings are formed parallel to and inside each edge of the one or more opaque transmission areas. Yet another embodiment comprises the step of forming a pattern of subresolution openings in a plurality of the one or more opaque transmission areas.

A further embodiment comprises the step of depositing the material to form a clear-field pattern. Yet another embodiment comprises the step of depositing the material such that the features represented in the mask pattern are positively biased.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Figure 1:
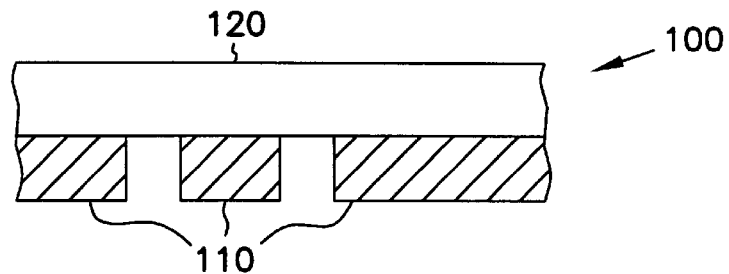
FIG. 1 is a schematic diagram illustrating the layers of a photomask.

As shown in FIG. 1, a photomask 100 is comprised of a pattern of material 110 deposited on a transparent plate 120. The transparent plate 120 must be free of defects on the surfaces as well as internally, and should have high optical transmission at the resist exposure wavelength. Several types of glasses have been used for making photomasks, including: soda-lime glass, borosilicate glass, and quartz. Quartz is the preferred type of glass to be used for the plate 120. Those skilled in the art will recognize, however, that other materials compatible with the resist process are acceptable, particularly when a material has favorable transmissivity characteristics when the wavelength of the exposure light source is less than 180 nm.

After the plate 120 has been polished, cleaned and inspected, it is ready for mask material 110 to be deposited. A clear-field pattern positions the opaque areas such that the lines are printed instead of the contacts. In an attenuated phase-shifting mask, a lightly transmissive absorbent material is deposited in what are designed to be the opaque areas of the mask. According to one embodiment, this material is a mixture of chromium, oxygen and nitrogen or a mixture of molybdenum, silicon, oxygen and nitrogen. One skilled in the art will recognize, however, that other materials with similar optical characteristics may be used without departing from the spirit and scope of this invention.

Figure 2:
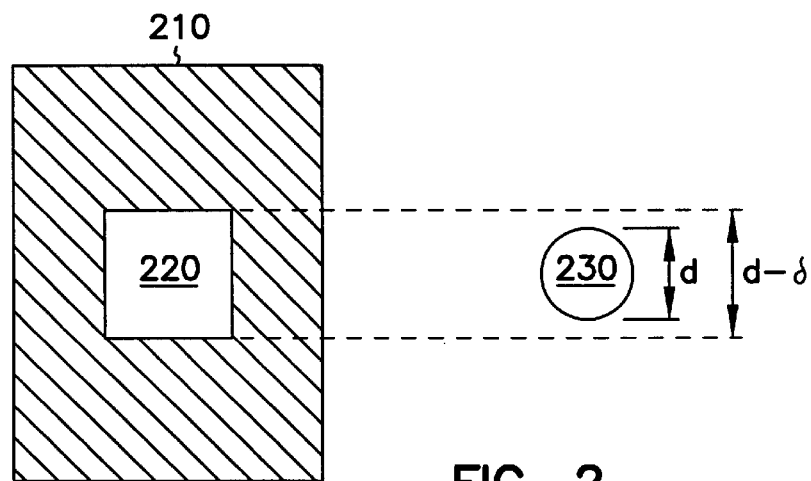
FIG. 2 is a schematic diagram illustrating a contact mask wherein the mask has a positive bias.
Figures 3A, 3B:
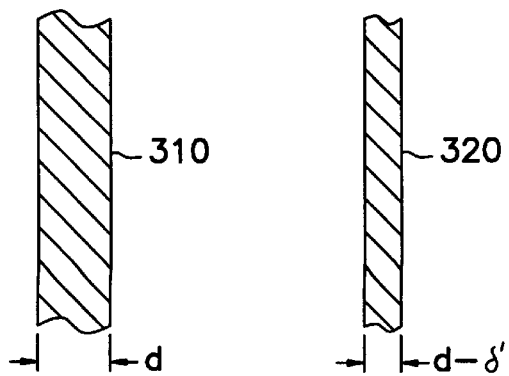
FIG. 3A is a schematic diagram illustrating a mask line with a positive bias.
FIG. 3B is a schematic diagram illustrating the feature on the wafer surface which results from exposing the mask line of FIG. 3A.

Conventional systems use a positive bias with dark-field patterns and a negative bias with clear-field patterns, primarily to control exposure times. The resulting reduced feature sizes on these conventional photomasks, however, force a reduction in process latitudes. One embodiment of the present invention introduces a slight positive bias with clear-field patterns in order to improve process latitudes. As shown in FIG. 2, the contact 220 at nominal size on the mask 210 is larger than the size of wafer contact 230 by a distance $\delta$, which is the amount of positive bias. The optimum value of $\delta$, in 365 nanometer lithography, is approximately 0.05 microns at 1x (wafer level). These numbers are exemplary only, however, and not intended to be exclusive or limiting. One skilled in the art will recognize that $\delta$ being positive is what is important in this embodiment and that $\delta$ may vary without exceeding the scope or spirit of the present invention. The distance $\delta$ compensates for the destructive interference of the light at the edge of the attenuating material. The result of introducing bias, illustrated in FIGS. 3A and 3B, is that actual-size (1x) attenuated mask patterns 310 are larger than wafer patterns 320 by an amount $\delta'$.

Figure 4A:
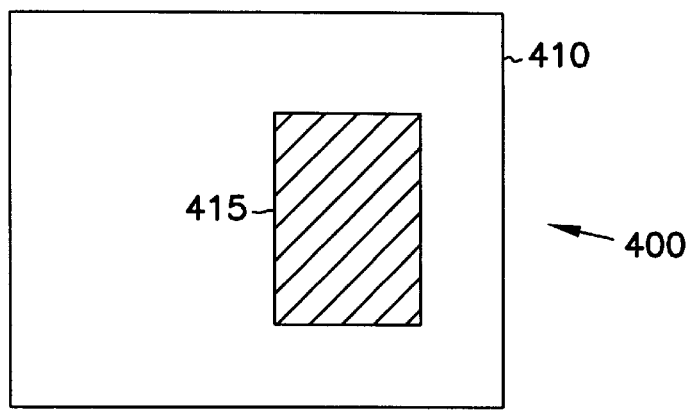
FIG. 4A is a schematic diagram representing a conventional attenuated phase-shifting mask.
Figure 4B:
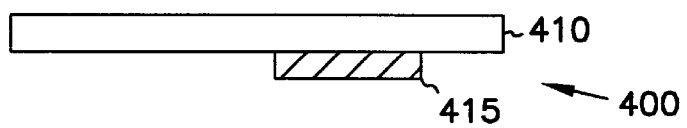
FIG. 4B is a schematic diagram representing a cross-sectional view of the mask of FIG. 4A.
Figure 4C:
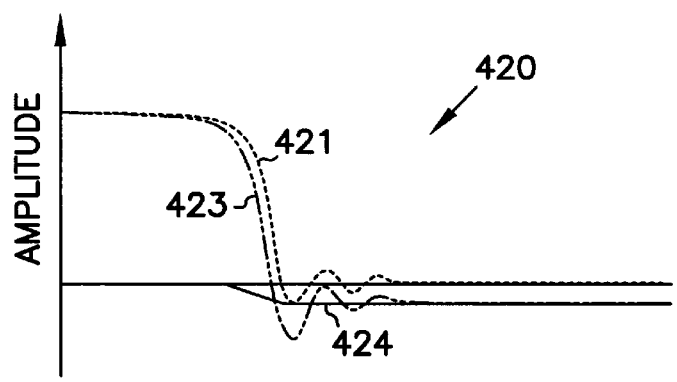
FIG. 4C is a graphic representation of the amplitude of energy waves which pass through the mask of FIG. 4A.
Figure 4D:
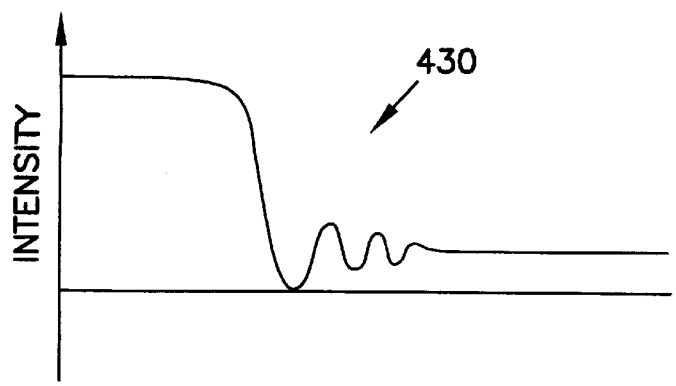
FIG. 4D is a graphic representation of the intensity of energy waves which pass through the mask of FIG. 4A.

Characteristic of the lithographic process, when positive bias is introduced in a clear-field mask the mask must be considerably overexposed. Overexposure produces several undesirable effects when using attenuating phase-shifting masking material. One such effect of overexposure is that parasitic side lobe printing along the edge of the pattern on the wafer generates a trench in the resist surface. Conventional systems therefore tend to reduce exposure times where ever possible, including using negative instead of positive bias for clear-field patterns. FIG. 4A shows a simple conventional mask 400, with a single transmission area 415 of attenuating material deposited on the transparent plate 410. FIG. 4B shows a cross-sectional view of the conventional mask shown in FIG. 4A. Amplitude graph 420 (FIG. 4C) shows the amplitude 421 of the energy waves which pass through the transparent plate 410, and the amplitude 424 of the energy waves which pass through the attenuating material 415. Amplitude line 423 shows the sum of the two transmissions. The resulting side lobe printing effect represented in intensity graph 430 (FIG. 4D) is due to constructive interference between the side lobe light created by the edge of the pattern and the main lobe light transmitted by the attenuating material. If this interference is not corrected, the side lobe printing effect will create a trench in the mask surface.

Figure 5A:
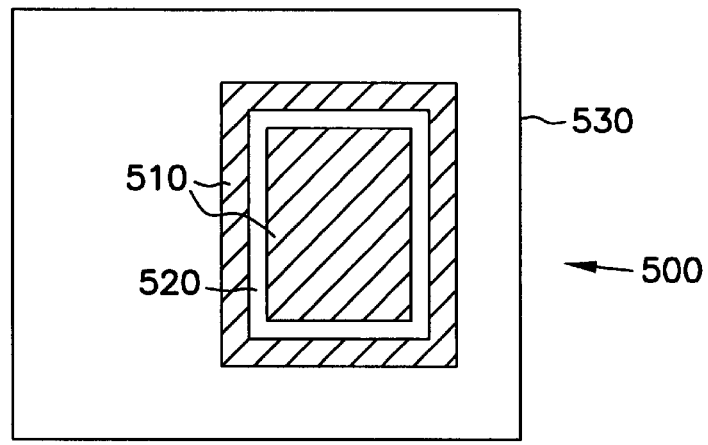
FIG. 5A is a schematic diagram representing an attenuated phase-shifting mask according to one embodiment of the present invention.
Figure 5B:
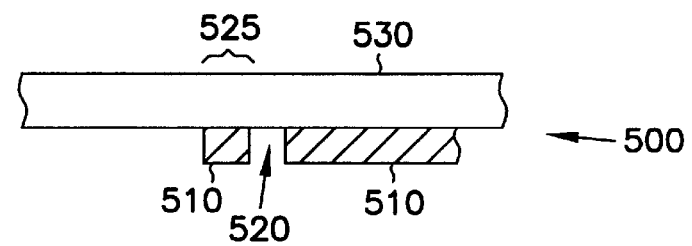
FIG. 5B is a schematic diagram representing a cross-sectional view of the mask of FIG. 5A.
Figure 5C:
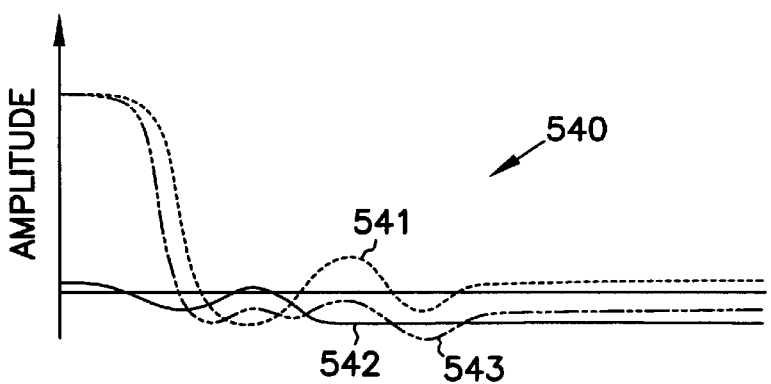
FIG. 5C is a graphic representation of the amplitude of energy waves which pass through the mask of FIG. 5A.
Figure 5D:
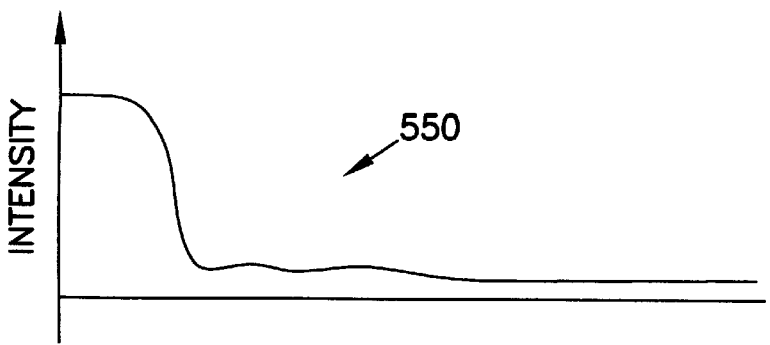
FIG. 5D is a graphic representation of the intensity of energy waves which pass through the mask of FIG. 5A.

FIG. 5A shows one example of a simple mask 500 according to one embodiment of the present invention. Those skilled in the art will readily recognize that the mask 500 of the example is simplified for descriptive purposes, and that the method and apparatus of the invention is applicable to masks of all ranges of complexity. Transmission area 510 is formed by depositing an attenuating material on the transparent plate 530. As the material is deposited a pattern of subresolution openings 520 is formed inside and parallel to the edge of the transmission area 510. FIG. 5B shows a cross-sectional view of the mask 500 shown in FIG. 5A. The pattern of subresolution openings 520 along the edge of the transmission area is incorporated in order to prevent printing side lobe light. The width of opening 520 is based on feature size, as is the distance 525 of opening 520 from the edge of the transmission area defining each feature. In the example shown, using 365 nanometer lithography and where mask features are five times larger than wafer features, opening 520 is approximately 0.75 microns wide and it is about the same distance from the feature edge. Those skilled in the art will readily recognize that these numbers are exemplary only, and that the size of the opening and its distance from the edge may vary according to process parameters such as wavelength and mask enlargement and not exceed the spirit and scope of the present invention. Since the opening is subresolution size, there is almost no first order diffraction, and the other orders of diffraction occur at a large angle and thus do not intersect the wafer surface. Amplitude graph 540 (FIG. 5C) shows how the energy waves which have passed through the transparent area 541 interact with the energy waves which have passed through the attenuating material 542 to expose the wafer surface more evenly 543 than conventional methods 423 (FIG. 4A). Intensity graph 550 (FIG. 5D) shows that the side lobe printing effect is canceled and the side lobe light is not printed. The net result is a well-formed pattern with no trenches formed in the resist.

Figure 6:
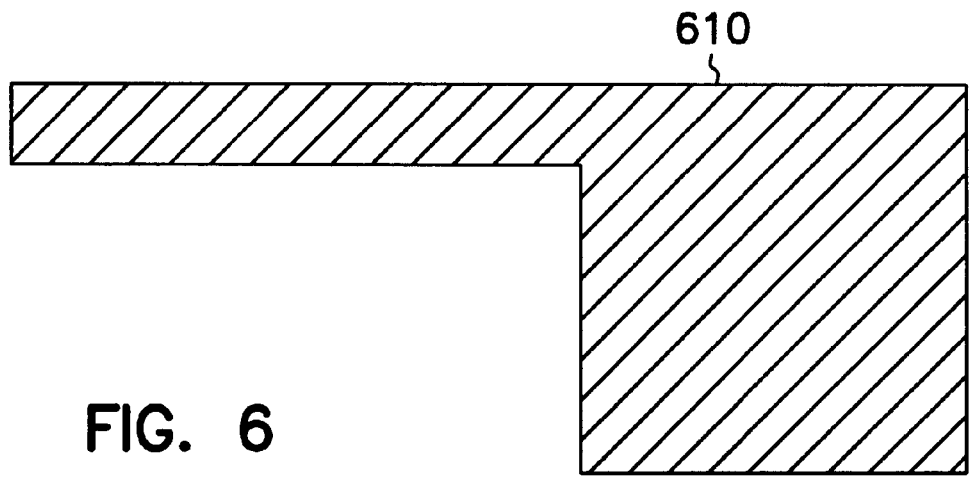
FIG. 6 is a schematic diagram showing a conventional attenuated phase-shifting mask with a large transmission area.
Figure 7:
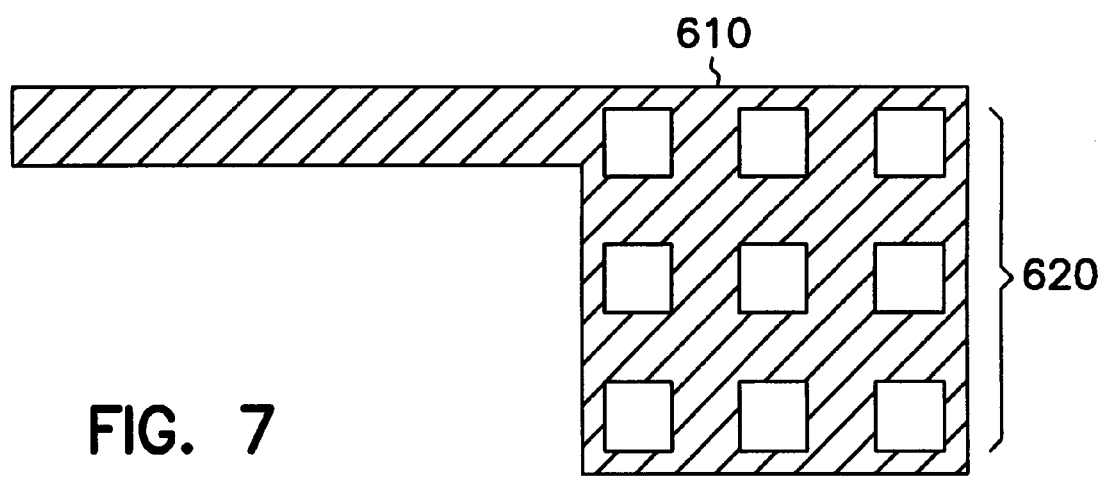
FIG. 7 is a schematic diagram showing an attenuated phase-shifting mask having large transmission area comprising subresolution openings according to one embodiment of the present invention.

Another effect of overexposing an attenuated phase-shifting mask is, as a result of the attenuating material being partially transparent, resist loss is observed in large opaque areas. To avoid the resist thickness loss in large transmission areas, a pattern of subresolution openings is incorporated in large opaque areas. FIG. 6 shows a conventional transition area comprising attenuating material. Extended exposure results in intensity build-up on the wafer surface and causes resist loss in that area. One example of a pattern of subresolution openings 620 according to one embodiment of the present invention is shown in FIG. 7. The pattern 620 acts as a diffraction grating, the openings being smaller than the wavelength emitted by the energy source, thereby diffracting the energy waves off the wafer surface. The result is a lower transmission level to the wafer surface and resist thickness is maintained. In the example shown, using 365 nanometer lithography with numerical aperture of 0.54 and a sigma of 0.6, the subresolution openings 620 are one-micron-square contacts placed one micron apart. In another example, having a numerical aperture of 0.60 and the sigma is 0.8, the openings are 0.8 microns square and are located 0.8 microns apart. It is to be recognized that these examples are intended to be illustrative only and the present invention is not so limited. Those skilled in the art will readily recognize that a wide variety of combinations of exposure parameters and subresolution opening dimensions may be employed without departing from the spirit and scope of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for manufacturing a photomask, comprising:
   preparing a transparent plate; and
   forming one or more transmission areas intermingled with one or more transparent areas, comprising:
      depositing attenuating phase-shifting material on the transparent plate in the transmission areas; and
      forming a plurality of subresolution openings in the one or more transmission areas.

2. The method of claim 1, wherein forming one or more transmission areas further comprises the step of forming a clear-field pattern.

3. The method of claim 2, wherein forming one or more transmission areas further comprises positively biasing the one or more transmission areas.

4. The method of claim 1, wherein forming the pattern of subresolution openings further comprises forming openings parallel to and inside each edge of the one or more opaque transmission areas.

5. The method of claim 1, wherein forming the pattern of subresolution openings further comprises forming a grid of regularly spaced openings.

6. A method for manufacturing a photomask comprising:
   preparing a transparent plate; and
   forming a positively biased clear field pattern on the transparent plate comprising one or more transmission areas intermingled with one or more transparent areas, comprising:
      depositing attenuating phase-shifting material on the transparent plate in the transmission areas;
      forming a plurality of subresolution openings parallel to and inside each edge of the one or more transmission areas; and
      forming a grid of subresolution openings within a plurality of the one or more transmission areas.

7. A photomask, comprising:
   a transparent plate; and
   a pattern of attenuating material deposited on the transparent plate, the pattern including:
      one or more transparent areas; and
      one or more transmission areas intermingled with the one or more transparent areas, one or more of each of the one or more transmission areas comprising a pattern of subresolution openings.

8. The photomask of claim 7, wherein the pattern of attenuating material is a clear-field pattern.

9. The photomask of claim 8, wherein the transmission areas are positively biased.

10. The photomask of claim 9, wherein the pattern of subresolution openings further comprises subresolution openings parallel to each edge of the one or more transmission areas.

11. The photomask of claim 9, wherein the pattern of subresolution openings further comprises a grid of regularly spaced openings.

12. A photomask, comprising:
   a transparent plate; and
   a clear-field pattern of attenuating material deposited on the transparent plate, the pattern including:
      one or more transparent areas; and
      one or more transmission areas intermingled with one or more transparent areas, the one or more transmission areas comprising a pattern of subresolution openings.

13. The photomask of claim 12, wherein the transmission areas are positively biased.

14. The photomask of claim 13, wherein the pattern of subresolution openings comprises subresolution openings parallel to each edge of the one or more transmission areas.

15. The photomask of claim 13, wherein the pattern of subresolution openings comprises a grid of regularly spaced openings.

16. A photomask, comprising:
   a transparent plate; and
   a positively biased clear-field pattern of attenuating material deposited on the transparent plate, the pattern comprising:
      one or more transparent areas; and
      one or more transmission areas intermingled with one or more transparent areas, the one or more transmission areas including:
         a pattern of subresolution openings parallel to and inside each edge of the one or more transmission areas; and
         a pattern of subresolution openings comprising a grid of regularly spaced openings.

* * * * *